United States Patent [19]
Park

[11] Patent Number: 5,512,854
[45] Date of Patent: Apr. 30, 1996

[54] DATA OUTPUT BUFFER FOR A SEMICONDUCTOR MEMORY DEVICE

[75] Inventor: Kee W. Park, Kyoungki-do, Rep. of Korea

[73] Assignee: Hyundai Electronics Industries Co., Inc., Kyoungki-do, Rep. of Korea

[21] Appl. No.: 365,012

[22] Filed: Dec. 28, 1994

[30] Foreign Application Priority Data

Dec. 31, 1993 [KR] Rep. of Korea ............... 93-31875

[51] Int. Cl.$^6$ ............................................. H03K 17/04
[52] U.S. Cl. .................. 327/374; 327/108; 327/172; 327/379; 326/85
[58] Field of Search ......................... 327/374, 375, 327/376, 377, 108, 109, 110, 111, 112; 326/83, 85, 86, 88

[56] References Cited

U.S. PATENT DOCUMENTS

| | | | |
|---|---|---|---|
| 4,973,865 | 11/1990 | Haq | 327/263 |
| 5,124,579 | 6/1992 | Naghshineh | 327/323 |
| 5,270,588 | 12/1993 | Choi | 327/537 |
| 5,319,258 | 6/1994 | Ruetz | 327/108 |
| 5,343,099 | 8/1994 | Shichinohe | 307/571 |
| 5,369,316 | 11/1994 | Chen et al. | 326/83 |
| 5,371,415 | 12/1994 | Dixon et al. | 327/109 |
| 5,396,133 | 3/1995 | Zhang | 327/434 |
| 5,398,318 | 3/1995 | Hiraishi et al. | 395/250 |
| 5,432,116 | 7/1995 | Keum et al. | 437/60 |
| 5,460,996 | 10/1995 | Ryou | 437/52 |
| 5,468,670 | 11/1995 | Ryou | 437/52 |

OTHER PUBLICATIONS

Ser. No. 08/297,759, Filed Aug. 30, 1994, by Keum et al.
Ser. No. 08/321,623, Filed Oct. 12, 1994, by Bae.
Ser. No. 08/323,230, Filed Oct. 14, 1994, by Bae.
Ser. No. 08/348,192, Filed Nov. 29, 1994, by Oh.
Ser. No. 08/358,755, Filed Dec. 19, 1994, by Oh.
Ser. No. 08/362,145, Filed Dec. 22, 1994, by Ham.

*Primary Examiner*—John S. Heyman
*Assistant Examiner*—Kenneth B. Wells
*Attorney, Agent, or Firm*—Nath & Associates; Gary M. Nath; Anthony D. Miller

[57] ABSTRACT

A data output buffer for a semiconductor memory device having a plurality of memory cells, each of the memory cells storing a data signal. The data output buffer comprises: an input line for inputting the data signal from each of the memory cells; a pull-up driver connected between a supply voltage source and an output line, the pull-up driver being driven in response to a first logic of the data signal from the input line; a pull-down driver connected between a ground voltage source and the output line, the pull-down driver being driven complementarily to the pull-up driver in response to a second logic of the data signal from the input line; at least one auxiliary pull-up driver connected in parallel to the pull-up driver; and a controller for driving the at least one auxiliary pull-up driver for a predetermined time period from a start portion of the first logic of the data signal from the input line. With this construction, the data output buffer can enhance a response characteristic of an output signal with respect to the input data signal to enhance the data access speed of the semiconductor memory device.

1 Claim, 3 Drawing Sheets

$V_{OH}$

DATA OUTPUT BUFFER FOR A SEMICONDUCTOR MEMORY DEVICE

BACKGROUND OF THE INVENTION

1. Field of the Invention

The present invention relates in general to a data output buffer for buffering a data signal read from a memory cell of a semiconductor memory device and outputting the buffered data signal externally, and more particularly, to a data output buffer for enhancing a response characteristic of an output signal with respect to the data signal read from the memory cell to enhance the data access speed of the semiconductor memory device.

2. Description of the Prior Art

Generally, a semiconductor memory device, such as a dynamic random access memory (DRAM), a static random access memory (SRAM), etc., comprises a data output buffer for matching a data signal read from a memory cell of the semiconductor memory device to external peripheral circuits. The data output buffer is adapted to regulate a voltage level of the data signal read from the memory cell to that required by the external peripheral circuits. However, such a conventional data output buffer has a disadvantage in that it has a relatively slow response characteristic with respect to the data signal read from the memory cell, resulting in a degradation in the data access speed of the semiconductor memory device.

For the purpose of enhancing the response characteristic with respect to the data signal read from the memory cell, the conventional data output buffer employs a pull-up device with a wide channel width at a drives stage. However, the use of the pull-up device with the wide channel width causes an output signal to become excessively high in its high logic state as a supply voltage is increased in level. For this reason, in the case where the data signal read from the memory cell is changed from high to low and vice-versa in logic with no hold time at a high impedance state, a voltage level of the output signal becomes large in variation. This large voltage variation of the output signal results in a delay in a data access time of the semiconductor memory device.

SUMMARY OF THE INVENTION

Therefore, the present invention has been made in view of the above problem, and it is an object of the present invention to provide a data output buffer for enhancing a response characteristic of an output signal with respect to an input data signal to enhance the data access speed of a semiconductor memory device.

In accordance with the present invention, in a semiconductor memory device having a plurality of memory cells, each of said memory cells storing a data signal, there is provided a data output buffer comprising: an input line for inputting the data signal from each of said memory cells; pull-up driving means connected between a supply voltage source and an output line, said pull-up driving means being driven in response to a first logic of the data signal from said input line; pull-down driving means connected between a ground voltage source and said output line, said pull-down driving means being driven complementarily to said pull-up driving means in response to a second logic of the data signal from said input line; at least one auxiliary pull-up driving means connected in parallel to said pull-up driving means; and control means for driving said at least one auxiliary pull-up driving means for a predetermined time period from a start portion of the first logic of the data signal from said input line.

BRIEF DESCRIPTION OF THE DRAWINGS

The above and other objects, features and advantages of the present invention will be mole clearly understood from the following detailed description taken in conjunction with the accompanying drawings, in which.

DETAILED DESCRIPTION OF THE PREFERRED EMBODIMENTS

Figure 1:
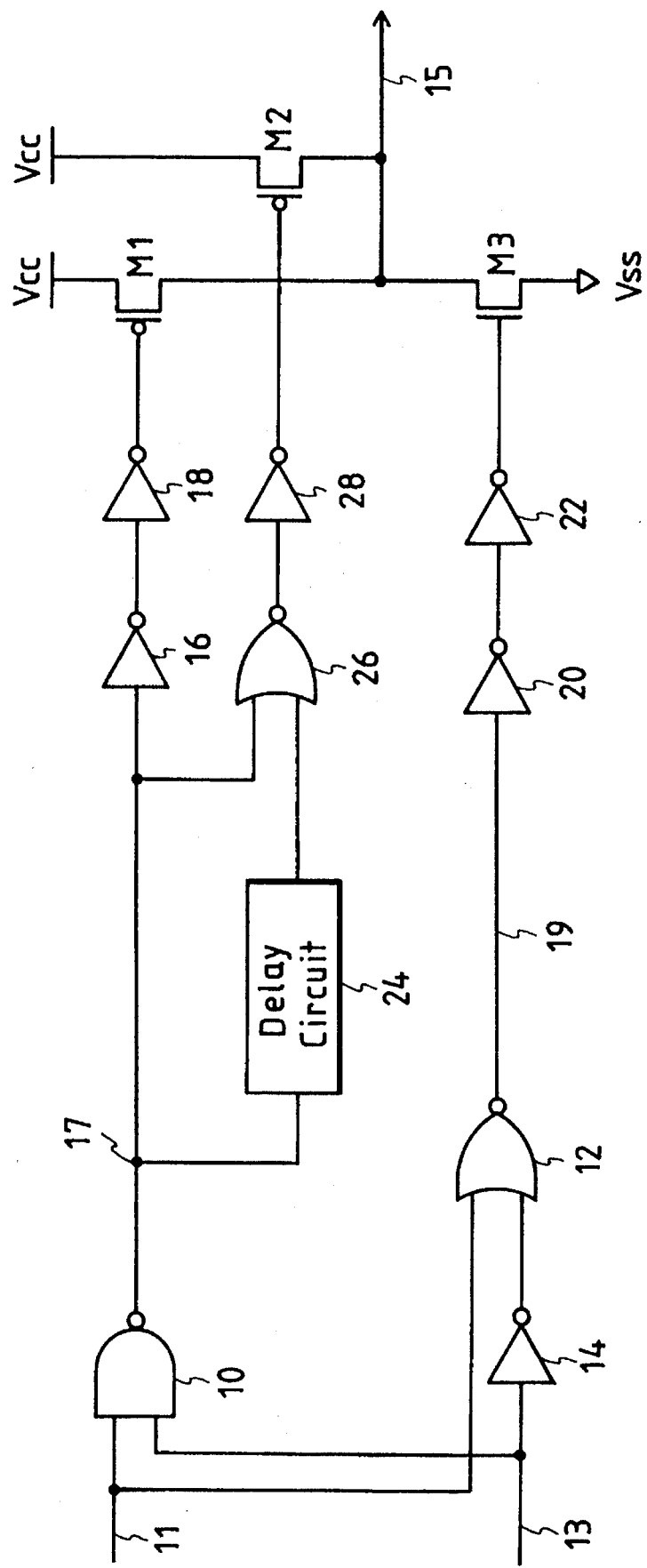
FIG. 1 is a circuit diagram of a data output buffer in accordance with an embodiment of the present invention.
Figure 2A:
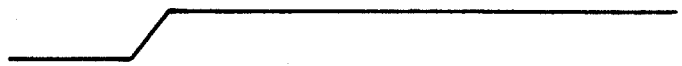
FIGS. 2A to 2G are waveform diagrams of signals from components in FIG. 1.
Figure 2B:
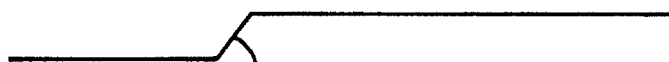
Figure 2C:
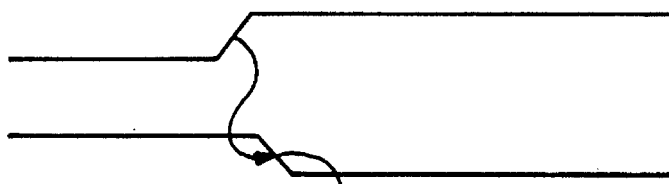

Referring to FIG. 1, there is shown a circuit diagram of a data output buffer in accordance with an embodiment of the present invention. As shown in this drawing, the data output buffer comprises a NAND gate 10 and a first NOR gate 12 for commonly inputting a data signal as shown in FIG. 2A from an input line 11, and an inverter 14 for receiving an output enable signal as shown in FIG. 2B from a control line 13. The output enable signal from the control line 13 is also applied to the NAND gate 10. When the output enable signal from the control line 13 is high in logic, the NAND gate 10 inverts the data signal from the input line 11 and outputs the inverted data signal to a first node 17. The output signal from the NAND gate 10 to the first node 17 has a waveform as shown in FIG. 2C. The inverter 14 inverts the output enable signal from the control line 13 and outputs the inverted output enable signal to the first NOR gate 12. When the output enable signal inverted by the inverter 14 is low in logic, the first NOR gate 12 inverts the data signal from the input line 11 and outputs the inverted data signal to a second node 19.

Figure 2E:

The data output buffer also comprises a first PMOS transistor M1 connected between a supply voltage source Vcc and an output line 15, and two inverters 16 and 18 connected in series between the first node 17 and a gate of the first PMOS transistor M1. The two inverters 16 and 18 delay the inverted data signal from the first node 17 for propagation delay times thereof and supply the resultant logic signal as shown in FIG. 2E to the gate of the first PMOS transistor M1. When the logic signal from the inverter series circuit 16 and 18 is low in logic, the first PMOS transistor M1 is turned on, so as to transfer a supply voltage from the supply voltage source Vcc to the output line 15 through its source and drain.

Figure 2F:
Figure 2G:
Figure 2D:

Further, the data output buffer comprises a delay circuit 24 and a second NOR gate 26 for commonly receiving the inverted data signal from the first node 17, and a second PMOS transistor M2 connected between the supply voltage source Vcc and the output line 15. The delay circuit 24 delays the inverted data signal from the first node 17 for a predetermined time period and supplies the resultant logic signal as shown in FIG. 2D to the second NOR gate 26. The second NOR gate 26 perform a NOR function on the output signal from the delay circuit 24 and the inverted data signal from the first node 17 and generates the resultant pulse signal which has a high logic pulse width corresponding to the delay time of the delay circuit 24. The pulse signal from the second NOR gate 26 is applied to an inverter 28. The inverter 28 inverts the pulse signal from the second NOR gate 26 and outputs the inverted pulse signal as shown in FIG. 2F to a gate of the second PMOS transistor M2. The second PMOS transistor M2 is turned on for a short duration of the inverted pulse signal from the inverter 28. Consequently, the second PMOS transistor M2 transfers the supply voltage from the supply voltage source Vcc to the output line 15 through its source and drain. As a result, the second PMOS transistor M2 is turned on for the delay time of the delay circuit 24 from the moment that the first PMOS transistor M1 is turned on, to increase an amount of current being supplied to the output line 15. The second PMOS transistor M2 has a channel width wider than that of the first PMOS transistor M1 to transfer a larger amount of current than that of the first PMOS transistor M1. For this reason, as shown in FIG. 2G, a voltage on the output line 15 is initially increased abruptly due to the current amount flowing thereto through the first and second PMOS transistors M1 and M2 and then gradually reduced to a desired level because of the supply of no current through the second PMOS transistor M2. Then, the voltage on the output line 15 remains at the desired level. As a result, an output signal generated on the output line 15 has an enhanced response speed with respect to the data signal. The first PMOS transistor M1 functions as a main pull-up driver, whereas the second PMOS transistor M2 functions as an auxiliary pull-up driver. The inverter series circuit 16 and 18 delays the inverted data signal from the first node 17 by propagation delay times of the delay circuit 24, the second NOR gate 26 and the inverter 28 so that the first and second PMOS transistors M1 and M2 can simultaneously be driven.

Further, the data output buffer comprises an NMOS transistor M3 connected between a ground voltage source Vss and the output line 15, and two inverters 20 and 22 connected in series between the second node 19 and a gate of the NMOS transistor M3. The two inverters 20 and 22 delay the inverted data signal from the second node 19 for propagation delay times thereof and supply the inverted and delayed data signal to the gate of the NMOS transistor M3. As a result, the inverter series circuit 20 and 22 acts to apply the inverted and delayed data signal to the gate of the NMOS transistor M3 at the same time that the logic signal from the inverter series circuit 16 and 18 is applied to the gate of the first PMOS transistor M1. When the inverted and delayed data signal from the inverter series circuit 20 and 22 is high in logic, the NMOS transistor M3 is turned on, so as to transfer a ground voltage from the ground voltage source Vss to the output line 15 through its source and drain. As a result, the NMOS transistor M3 functions as a pull-down driver for generating a low logic signal of the ground voltage on the output line 15.

Figure 4A:
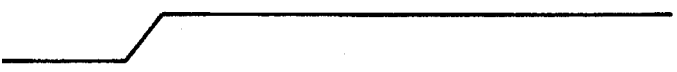
FIGS. 4A to 4G are waveform diagrams of signals from components in FIG. 3.
Figure 4B:
Figure 4C:
Figure 4D:
Figure 3:
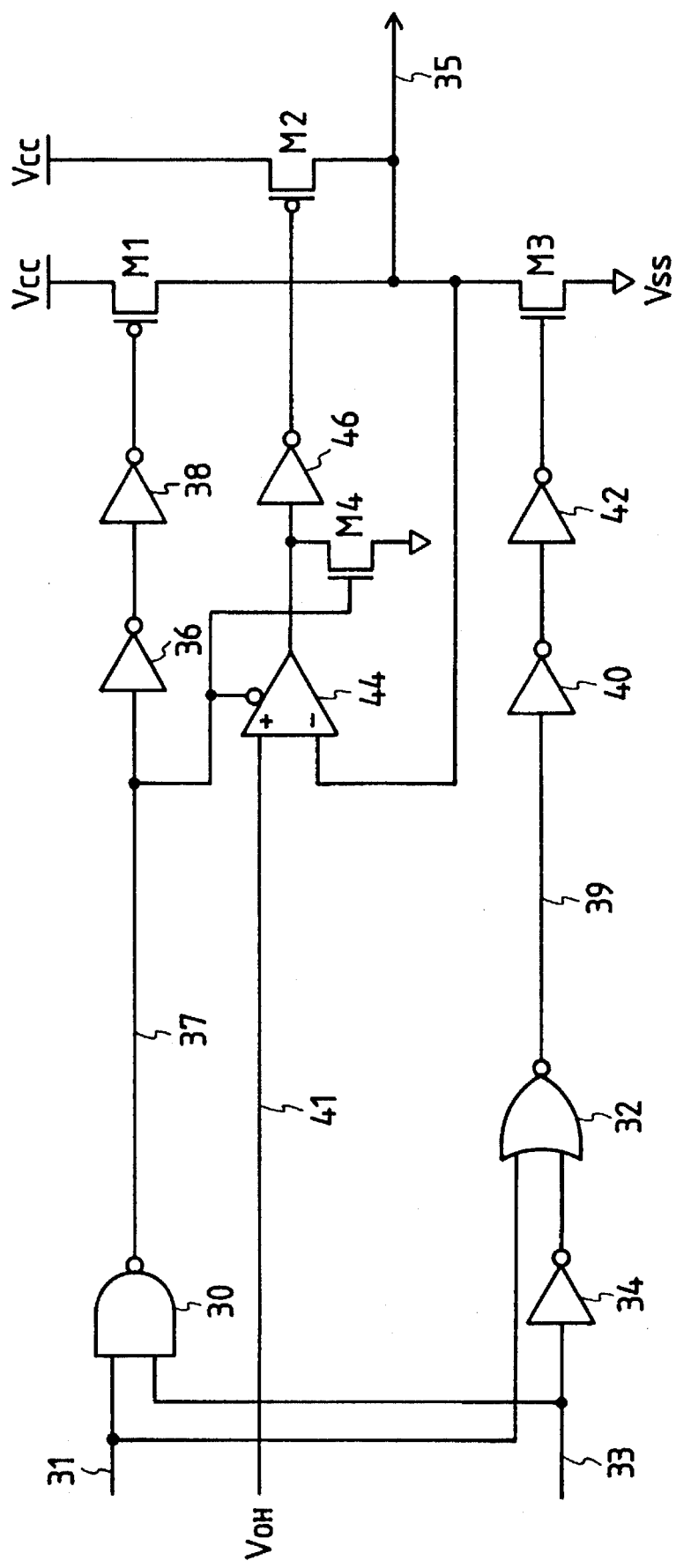
FIG. 3 is a circuit diagram of a data output buffer in accordance with an alternative embodiment of the present invention.

Referring to FIG. 3, there is shown a circuit diagram of a data output buffer in accordance with an alternative embodiment of the present invention. As shown in this drawing, the data output buffer comprises a NAND gate 30 and a first NOR gate 32 for commonly receiving a data signal as shown in FIG. 4A from a first input line 31, and an inverter 34 for inputting an output enable signal as shown in FIG. 4B from a control line 33. The output enable signal from the control line 33 is also applied to the NAND gate 30. When the output enable signal from the control line 33 is high in logic, the NAND gate 30 inverts the data signal from the first input line 31 and outputs the inverted data signal to a first node 37. The output signal from the NAND gate 30 to the first node 37 has a waveform as shown in FIG. 4C. The inverter 34 inverts the output enable signal from the control line 33 and outputs the inverted output enable signal to the first NOR gate 32. When the output enable signal is inverted by the inverter 34 is low in logic, the first NOR gate 32 inverts the data signal from the first input line 31 and outputs the inverted data signal to a second node 39.

Figure 4E:

The data output buffer also comprises a first PMOS transistor M1 connected between a supply voltage source Vcc and an output line 35, and two inverters 36 and 38 connected in series between the first node 37 and a gate of the first PMOS transistor M1. The two inverters 36 and 38 delay the inverted data signal from the first node 37 for propagation delay times thereof and supply the resultant logic signal as shown in FIG. 4E to the gate of the first PMOS transistor M1. When the logic signal from the inverter series circuit 36 and 38 is low in logic, the first PMOS transistor M1 is turned on, so as to transfer a supply voltage from the supply voltage source Vcc to the output line 35 through its source and drain.

Further, the data output buffer comprises a first NMOS transistor M3 connected between a ground voltage source Vss and the output line 35, and two inverters 40 and 42 connected in series between the second node 39 and a gate of the first NMOS transistor M3. The two inverters 40 and 42 delay the inverted data signal from the second node 39 for propagation delay times thereof and supply the inverted and delayed data signal to the gate of the first NMOS transistor M3. When the inverted and delayed data signal from the inverter series circuit 40 and 42 is high in logic, the first NMOS transistor M3 is turned on, so as to transfer a ground voltage from the ground voltage source Vss to the output line 35 through its source and drain. In result, the first NMOS transistor M3 functions as a pull-down driver for generating a low logic signal of the ground voltage on the output line 35.

Figure 4F:
Figure 4G:
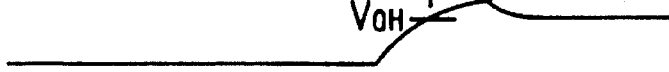

Further, the data output buffer comprises a second PMOS transistor M2 connected between the supply voltage source Vcc and the output line 35, a comparator 44 for inputting a reference voltage $V_{OH}$ from a second input line 41, and a second NMOS transistor M4 connected between an output terminal of the comparator 44 and the ground voltage source Vss. The comparator 44 also has a control terminal for inputting the inverted data signal from the first node 37. When the inverted data signal from the first node 37 is low in logic, the comparator 44 compares a voltage of an output signal on the output line 35 with the reference voltage $V_{OH}$ from the second input line 41. If the voltage of the output signal on the output line 35 is lower than the reference voltage $V_{OH}$ from the second input line 41, the comparator 44 generates a high logic comparison signal. On the contrary, if the voltage of the output signal on the output line 35 is higher than the reference voltage $V_{OH}$ from the second input line 41, the comparator 44 generates a low logic comparison signal. As a result, the comparator 44 generates a pulse signal which has a high logic pulse width corresponding to a time period from a falling edge of the inverted data signal from the first node 37 until the voltage of the output signal on the output line 35 reaches the reference voltage $V_{OH}$. The pulse signal from the comparator 44 is applied to an inverter 46. The inverter 46 inverts the pulse signal from the comparator 44 and outputs the inverted pulse signal as shown in FIG. 4F to a gate of the second PMOS transistor M2. The second PMOS transistor M2 is turned on for a short duration of the inverted pulse signal from the inverter 46. Consequently, the second PMOS transistor M2 transfers the supply voltage from the supply voltage source Vcc to the output line 35 through its source and drain. As a result, the second PMOS transistor M2 is turned on for a time period from the turning-on of the first PMOS transistor M1 until the voltage of the output signal on the output line 35 arrives at the reference voltage $V_{OH}$, to increase an amount of current being supplied to the output line 35. The second PMOS transistor M2 has a channel width wider than that of the first PMOS transistor M1 to transfer a larger amount of current than that of the first PMOS transistor M1. For this reason, as shown in FIG. 4G, a voltage on the output line 35 is initially increased abruptly above the reference voltage $V_{OH}$ due to the current amount flowing thereto through the first and second PMOS transistors M1 and M2 and then gradually reduced to the reference voltage $V_{OH}$ because of the supply of no current through the second PMOS transistor M2. Then, the output signal on the output line 35 remains stably at the reference voltage $V_{OH}$. In result, the output signal on the output line 35 has an enhanced response speed with respect to the data signal. The first PMOS transistor M1 functions as a main pull-up driver, whereas the second PMOS transistor M2 functions as an auxiliary pull-up driver. The inverter series circuit 36 and 38 delays the inverted data signal from the first node 37 by propagation delay times of the comparator 44 and the inverter 46 so that the first and second PMOS transistors M1 and M2 can simultaneously be driven. Also, the inverter series circuit 40 and 42 acts to apply the inverted and delayed data signal to the gate of the first NMOS transistor M3 at the same time that the logic signal from the inverter series circuit 36 and 38 is applied to the gate of the first PMOS transistor M1. On the other hand, the inverted data signal from the first node 37 is also applied to a gate of the second NMOS transistor M4. When the inverted data signal from the first node 37 is high in logic, the second NMOS transistor M4 is turned on, so as to transfer the ground voltage from the ground voltage source Vss to an input terminal of the inverter 46 through its source and drain. In result, the second NMOS transistor M4 acts to prevent a faulty operation of the inverter 46 when the output signal from the comparator 44 is at a high impedance state.

As apparent from the above description, according to the present invention, the auxiliary driver is driven for the predetermined time period from the start portion of the input data signal to enhance the voltage rise speed of the output signal and limit the excessive voltage rise thereof under the high logic state. Therefore, the data output buffer of the present invention has the effect of enhancing the data access speed of a semiconductor memory device and minimizing noise generation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A data output buffer for a semiconductor memory device having a plurality of memory cells, each of said memory cells storing a data signal, the data output buffer comprising:

an input line for receiving the data signal from each of said memory cells;

pull-up driving means connected between a supply voltage source and an output line, said pull-up driving means being driven in response to a first logic state of the data signal from said input line;

pull-down driving means connected between a ground voltage source and said output line, said pull-down driving means being driven complementarily to said pull-up driving means in response to a second logic state of the data signal from said input line;

at least one auxiliary pull-up driving means connected in parallel to said pull-up driving means; and control means for driving said at least one auxiliary pull-up driving means for a time period from a start portion of the first logic state of the data signal from said input line until a voltage on output line reaches a reference voltage, said control means including:

a comparator being driven in response to the first logic state of the data signal from said input line to compare a voltage of an output signal on said output line with the reference voltage; and a gate means for switching the compared result from said comparator to said at least one auxiliary pull-up driving means responding to the data signal from said input line.

\* \* \* \* \*